United States Patent [19]

Hettiger

[11] Patent Number: 4,598,423

[45] Date of Patent: Jul. 1, 1986

[54] TUNING CIRCUIT FOR A MULTIBAND TUNER

[75] Inventor: James Hettiger, Marion County, Ind.

[73] Assignee: RCA Corporation, Princeton, N.J.

[21] Appl. No.: 705,500

[22] Filed: Feb. 28, 1985

[51] Int. Cl.$^4$ .......................... H04B 1/16; H03J 5/00
[52] U.S. Cl. ................................. 455/191; 455/196; 334/15; 331/179
[58] Field of Search ............... 455/180, 188, 191, 196; 334/14, 15; 358/191.1; 331/179

[56] References Cited

U.S. PATENT DOCUMENTS

| | | | |
|---|---|---|---|
| 3,264,566 | 8/1966 | Kaufman et al. | 325/465 |
| 4,363,135 | 12/1982 | Moon | 455/180 |
| 4,380,827 | 4/1983 | Moon | 455/179 |
| 4,404,686 | 9/1983 | Moon | 455/191 |
| 4,418,427 | 11/1983 | Muterspaugh | 455/191 |

Primary Examiner—Jin F. Ng
Attorney, Agent, or Firm—Eugene M. Whitacre; Paul J. Rasmussen; Peter M. Emanuel

[57] ABSTRACT

A multiband local oscillator of a television tuner comprises a common collector transistor amplifier, a feedback circuit for conditioning the amplifier to oscillate in the wide range of frequencies for VHF broadcast and cable channels and a tuning circuit coupled to the base electrode of the transistor. Bandswitching signals are applied to switching diodes in the multiband tuning circuit to produce tuned circuit configurations for the various frequency bands. When one band is selected, the corresponding bandswitching signal is coupled to the switching diode associated with a lower band to turn it on as well as the switching diode for the selected band to inhibit out-of-band oscillators due to parasitic elements of the tuning circuit.

7 Claims, 1 Drawing Figure

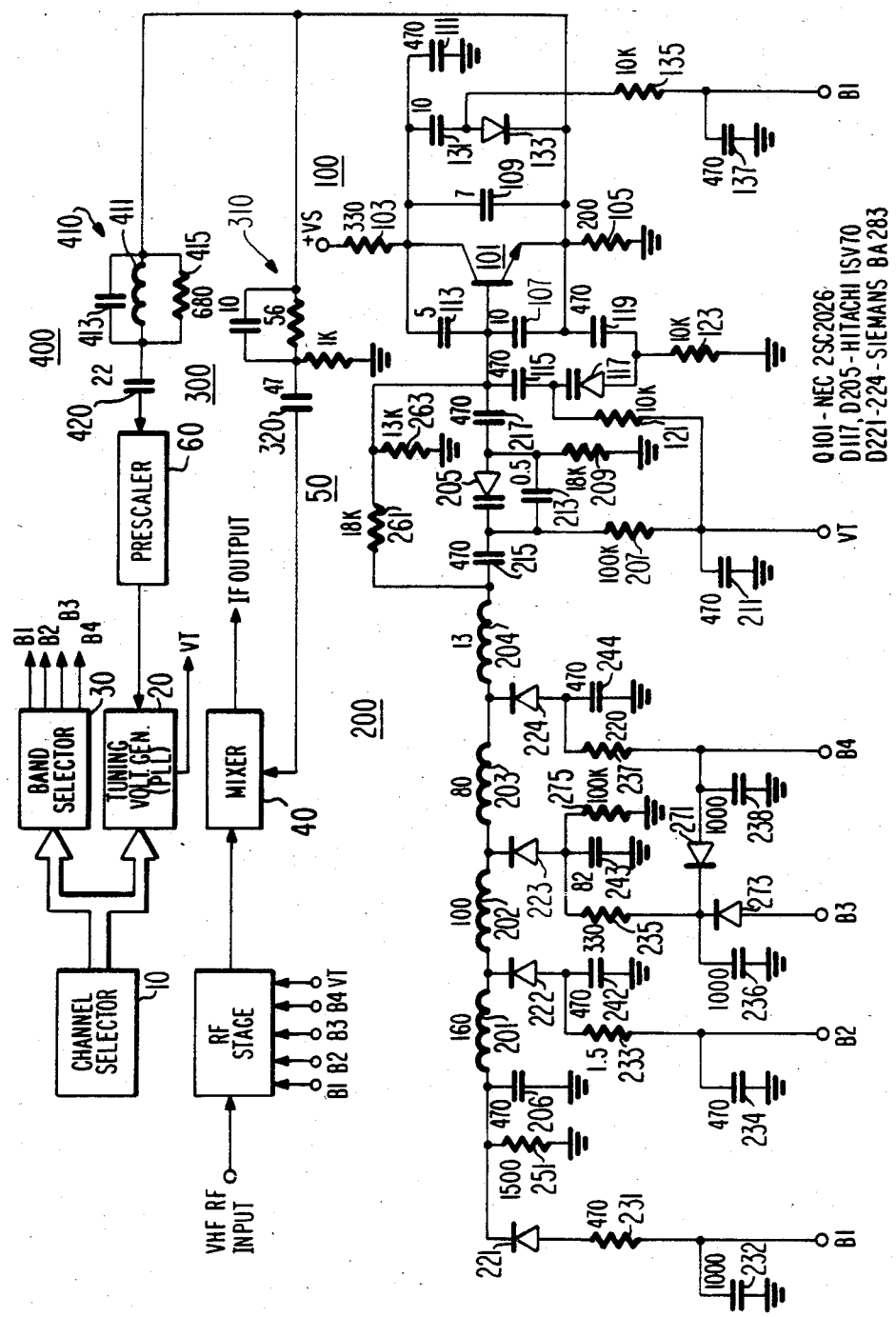

TUNING CIRCUIT FOR A MULTIBAND TUNER

The present invention concerns a multiband oscillator having a relatively wide frequency range suitable for use in a television tuner.

With the increasing use of cable distribution networks, it is desirable for television tuners to be capable of tuning cable as well as broadcast channels. Typically, such "cable ready" (i.e., "ready" to tune cable channels without a cable converter) tuners are partitioned into sections corresponding to respective frequency ranges. For example, a cable ready tuner may include a UHF section for UHF broadcast channels and a VHF section for VHF broadcast and cable channels. For reliability and cost purposes, it is desirable to minimize the number of parts used in the tuner. To this end, it is desirable to use only one local oscillator in each section of the tuner.

The disclosed apparatus generally concerns a local oscillator which may be used for all of the VHF broadcast and cable channels which, e.g., in the United States lie in a relatively wide frequency range between 101 MHz and 509 MHz. While such a local oscillator is highly desirable, it does present problems because of its relatively wide frequency range. More specifically, in order to accommodate the relatively wide frequency range utilizing a frequency determining tuning circuit having only a single tuning voltage responsive varactor diode, it has been found necessary to include bandswitching provisions for selecting different inductors for inclusion in the tuning circuit with the varactor diode depending on the frequency band of the selected channel. Such bandswitching arrangements have been found to introduce parasitic elements which cause the local oscillator to oscillate at undesired frequencies.

The present invention concerns a tuning circuit, e.g., which may be used in the above-described type of local oscillator for tuning throughout a relatively wide frequency range including a plurality of frequency bands, with provisions for inhibiting undesired frequency responses due to parasitic components. Specifically, the tuning circuit comprises a variable capacitance element such as a varactor diode, and at least first, second and third inductors coupled in series between the variable capacitance element and a point of reference potential, first switch means for selectively coupling a first point between the first and second inductors to the point of reference potential in response to a first bandswitching signal to form a first tuned circuit configuration corresponding to a first frequency band and second switch means for selectively coupling a second point between the second and third inductors to the point of reference potential in response to a second bandswitching signal to form a second tuned circuit configuration corresponding to a second frequency band lower in frequency than the first frequency band. The undesired frequency response inhibiting provision comprises auxiliary switch means for selectively coupling the second point between the second and third inductors to the point of reference potential in response to the first band switching signal. This has the effect of substantially isolating the third inductor and any parasitic elements associated with it from the first tuned circuit. Desirably the auxiliary switch means includes provisions for isolating the two bandswitching signals from one another so that other circuits are responsive to respective ones of the first and second bandswitching signals may be selected independently of one another.

The invention will be described with reference to a preferred embodiment shown in schematic form in the accompanying Drawing consisting of a sole FIGURE. Typical component values are indicated. Unless otherwise indicated, the values are in ohms, nanohenries and picofarads.

The sole FIGURE shows a televsion tuner for tuning VHF broadcast and cable channels. By way of example, for use in the United States, the tuner is capable of tuning channels for which the RF picture carrier and local oscillator frequencies are specified in the following table.

| BAND | RF RANGE (MHz) | LO RANGE (MHz) |
| --- | --- | --- |
| B1 | 55.25–83.25 | 101–129 |
| B2 | 91.25–151.25 | 137–197 |
| B3 | 157.25–265.25 | 203–311 |
| B4 | 271.25–463.25 | 317–509 |

It will be appreciated that: band B1 corresponds to channels of the low VHF broadcast band (i.e., channels 2–6); band B2 corresponds to channels in a lower portion of the midband cable band; band B3 corresponds to channels in the remaining portion of the midband cable band, channels in the high VHF broadcast band (i.e., channels 7–13, and channels in the lower portion of the superband cable band; and band B4 corresponds to channels in the remaining portion of the superband cable band, and channels in the hyperband cable band. A separate section for a fifth band for UHF braodcast channels (14–69) is not shown.

A channel selector 10, including for example, a calculator like keyboard, by which a user may enter the two digit number corresponding to the desired channel is provided. The channel number is conveyed, in digital code form to a tuning voltage generator 20, including for example, a phase locked loop, for converting the channel number to a tuning voltage, VT, having a magnitude corresponding to the selected channel. The channel number is also conveyed to a band selector 30 which generates a band selection or bandswitching signal designating the band of the selected channel. In the embodiment shown, the active state of each of the bandswitching signals, B1, B2, B3 and B4, generated by band selector 30 is a high positive voltage, e.g., +18 volts. The inactive state is a voltage near ground potential. Band selector 30 generates a unique bandswitching signal for each band which is independent of all the other bandswitching signals. That is, each band corresponds to only one bandswitching signal. For this purpose, band selector 30 may simply comprise a logic comparator for determining when the coded designation of the desired channel is within ranges of values corresponding to respective bands.

The tuning voltage and the bandswitching signals are coupled to an RF section 30 for selecting the RF signal corresponding to the selected channel from the plurality of RF singals received at a VHF RF input and supplying the selected RF signal to a mixer 40. The tuning voltage and bandswitching signals are also coupled to a local oscillator 50 which generates a local oscillator signal having a frequency corresponding to the selected channel. The local oscillator signal is also coupled to mixer 40 where it is combined with the selected RF signal to provide sum and difference frequency signals. The frequency of the local oscillator signal is controlled so that the difference frequency signal has a nominal picture carrier frequency, e.g., 45.75 MHz in the United States.

When tuning control unit 20 includes a phase locked loop, the local oscillator signal is also coupled to tuning control unit 20 via a frequency divider 60 usually called a "prescaler" which divides the relatively high frequency of the local oscillator signal to provide a signal having a frequency compatible with the operating frequency range of the phase locked loop.

The construction of local oscillator 50 and will now be described in detail.

Local oscillator 50 comprises an amplifier 100 and a tuning circuit 200. Amplifier 100 includes a NPN transistor 101 in common collector configuration with its collector connected through a resistor 103 to a source of supply voltage +VS, it emitter connected through a resistor 105 to a source of reference potential shown as signal ground and its base electrode coupled to tuning circuit 200. A feedback network, comprising a capacitor 107 connected between the base and emitter electrodes, a capacitor 109 connected between the emitter and collector electrodes, a capacitor 111 coupled between the collector electrode and signal ground, and a capacitor 113 connected between the collector and base electrodes, conditions amplifier 100 to oscillate throughout the frequency range, e.g., 101–509 MHz, including frequency bands B1, B2, B3 and B4.

To ensure that oscillator 100 is capable of oscillating throughout the relatively wide frequency range between 101 and 509 MHz reliably, it has been found desirable to modify the feedback in response to the tuning voltage. Specifically, this is accomplished by connecting a tuning voltage responsive capacitance network including a capacitor 115, a varactor diode 117 and a capacitor 119 connected in series between the base and emitter electrodes of transistor 101 in parallel with capacitor 107. Capacitors 115 and 119 have relatively large values and have essentially no affect on the capacitance range of the feedback modifying network and serve primarily as DC blocking elements. Resistors 121 and 123 are provided to apply a portion of the tuning voltage, VT, across varactor diode 117. Varactor diode 117 is poled to increase the capacitance between the base and emitter electrodes as the frequency decreases in response to decreases of the tuning voltage.

Tuning circuit 200 includes four inductors 201, 202, 203 and 204 and a varactor diode 205 connected in series, in the order named, between signal ground, via a capacitor 206, and the base electrode of transistor 101. The tuning voltage, VT, is coupled to the cathode of varactor diode 205 through an isolation resistor 207. A resistor 209, connected between the anode of varactor diode 205 and signal ground, provides a return path for varactor diode 205. A shunt connected capacitor 211 filters the tuning voltage. A small valued capacitor 213 is coupled across varactor diode 205 to help establish the variable capacitance range of the tuning circuit. Relatively large valued capacitors 215 and 217 are connected in series with varactor diode 205 to isolate the cathode and anode from the DC voltages developed at the right end of inductor 204 and the base electrode of transistor 101, respectively. Capacitors 215 and 217 do not significantly affect the capacitance range of the tuning circuit.

Bandswitching is accomplished as follows.

The cathode of bandswitching pin diodes 221, 222, 223 and 224 are connected to left end of inductor 201, the junction between inductors 201 and 202, the junction between inductors 202 and 203 and the junction between inductors 203 and 204, respectively. The anodes of switching diodes receive bandswitching signals B1, B2, B3 and B4 via respective resistor/capacitor networks 231/232, 233/234, 235/236, and 237/238, respectively. Capacitors 232, 234, 236 and 238 are filter capacitors. The anodes of switching diodes 222, 223 and 224 are also coupled to signal ground through capacitors 242, 243 and 244, respectively. Capacitors 242 and 244 have relatively large values and essentially are bypass capacitors. Capacitor 243 has a smaller value than capacitors 242 and 244 for the reason explained below.

A resistor 251, connected between the junction of diode 221 and inductor 201 and signal ground, serves as a return for the bandswitching diodes 221, 222, 223 and 224. When any one of diodes 221, 222, 223 or 224 is forward biased to be turned on in response to the respective one of bandswitching signals B1, B2, B3 and B4 being at the relatively high positive active voltage level, e.g., +18 volts, current is caused to flow through resistor 251 and a reverse bias voltage for turning the remaining diodes off is developed across resistor 251.

A base bias network, which is connected between inductor 204 and the base of transistor 101 and bypasses capacitor 215, varactor diode 205 and capacitor 217, includes a series connected resistor 261 and shunt connected resistor 263.

When a channel in band B1 is selected, bandswitch signal B1 is caused to be at the relatively high positive active voltage level, e.g., +18 volts, corresponding to the active state, and positive bias voltage for turning transistor 101 on is coupled to the base of transistor 101 through resistor 231, switching diode 221, inductors 201, 202, 203 and 204, and base bias network 261/263. When a channel in band B1, the lowest frequency band, is selected, switching diodes 222, 223 and 224 are all turned off and a tuned circuit for band B1 is formed having the maximum tuning inductance including all of inductors 201, 202, 203 and 204. When a channel in band B2 is selected, switching diode 222 is turned on thereby effectively connecting the junction of inductors 201 and 202 to signal ground to form a tuned circuit for band B2 including inductors 202, 203 and 204. When a channel in band B3 is selected, switching diode 223 is turned on to form a tuning circuit for band B3 including inductors 203 and 204. In similar fashion, when a channel in band B4, the highest frequency band, is selected, switching diode 224 is turned on to form a tuned circuit for band B4 having the minimum tuning inductance including only inductor 204 (discounting parasitic elements to be discussed below). For each of bands B2, B3 and B4 base bias voltage is supplied through the respective one of resistors 233, 235 and 237.

Due to the relatively wide frequency range of local oscillator 50 certain parasitic elements associated with tuning circuit 200 have been found to cause local oscillator to tend to oscillate at undesired frequencies. The provisions for inhibiting such conditions will not be described.

When band B1 is selected, as earlier noted, switching diodes 222, 223 and 224 are turned off. With the configuration shown, it has been found that in band B1, the parastic capacitances across respective ones of inductors 201, 202, 203 and 204 and "off" switching diodes 222, 223 and 224 cause a second, undesired resonance frequency in band B4 at around 470 HMz at which local oscillator is capable of oscillating (in addition to the primary, desired frequency in band B1). The solution to this problem has been found to be to selectively change the capacitance feedback network, which conditions amplifier 100 to oscillate, in band B1 so as to limit the range of oscillation to be below the undesired frequency. Specifically, this is accomplished by connecting a capacitor 131 and a switching diode 133 between the emitter and collector of transistor 101 in parallel with capacitor 109. The B1 bandswitching signal is coupled to the anode of switching diode 133 by an isolation/filter network including a series-connected resistor 135 and a shunt connected capacitor 137. The return for bandswitching signal B1 is provided by resistor 105 connected to the emitter of transistor 101 and the cathode of switching diode 133. When a channel in band B1 is selected, switching diode 133 is turned on and capacitor 131 is coupled in parallel with capacitor 109 to increase the capacitance between the emitter and collector of transistor 101. The emitter voltage is also increased which changes the bias of transistor 101.

It is noted that while switched capacitance network 131/133 inhibits undesired out-of-band oscillations, it does not change the basic mode of operation of local oscillator 50 and is therefor relatively simple in implementation. In addition, switching the feedback in the manner described above between band B1 and the other bands, has been found to decrease the conversion loss and therefore increase the overall tuner gain in band B4 which might be the case if a value of capacitance between the emitter and collector of transistor 101 where chosen as a compromise between the requirements for bands B1 and B4. Along these lines, switched capacitance network 131/133 has also been found to extend the tuning range for band B1 which is advantageous in that it allows other design constraints to be relaxed.

Other undesired frequencies may be generated due to the parasitic lead inductances of switching diodes 221, 222, 223 and 224. Specifically, when a channel in the band B4, is selected and switching diode 224 is turned "on" to exclude the portions of tuning circuit 200 to the left of inductor 204 from the tuned circuit for band B4, the lead inductance of diode 224 has been found to present a large enough impedance in band B4, the highest frequency band, to effectively allow the elements of tuning circuit 200 to the left of inductor 204 and their associated parasitic elements, such as the parasitic capacitances across inductors 201, 202 and 203, to be coupled in the tuned circuit for band B4. In other words, "on" switching diode 224 does not effectively "short out" the portion of tuning circuit 200 to the left of inductor 204 and thereby undesirably allows signal current to flow in it. This causes undesired frequency resonances at which local oscillator 50 may oscillate.

This problem is solved by an auxiliary bandswitching network including a switching diode 271 connected between the B4 bandswitching control line and the B3 bandswitching control line. When a channel in band B4 is selected, the relatively large positive active voltage level of bandswitching signal B4 causes switching diode 223 for band B3, as well as switching diode 224 for band B4, to be turned on. This significantly reduces the coupling of the portion of tuning circuit 200 to the left of inductor 204 to the tuned circuit for band B4 (to the right of inductor 203) and effectively inhibits the creation of undesired frequency resonances. While switching diode 222 may also be turned on for similar reaons in the same manner by the connection of another switching diode between the B4 bandswitching control line and the B2 bandswitching control line, in the configuration shown, this has been found not to be necessary. As a result, the extra power required to turn on all three of switching diodes 224, 223 and 222 in band B4 is advantageously saved.

Diode 271 is poled to allow bandswitching signal B4 to turn on band B3 switching diode 223 but to prevent bandswitching signal B3 from turning on band B4 switching diode 224. The auxiliary bandswitching network also includes a switching diode 273 connected in series in the B3 bandswitching control line and is poled to allow bandswitching signal B3 to turn on band B3 switching diode 223 but to isolate the voltage on the B3 bandswitching control line from being affected by bandswitching signal B4. The isolation functions of diodes 271 and 273 are highly desirable since it is desired to control the bandswitching of other tuned circuits, such as those included in RF stage 30, independently of one another.

Since diodes 271 and 273 isolate capacitor 243 from the B3 and B4 control lines, a large valued resistor 275 is connected in shunt with capacitor 243 to enable it to discharge.

Normally capacitors 242, 243 and 244 associated with bandswitching diodes 221, 222, 223 and 224 are all chosen to have relatively large values (e.g., all may choose to be 470 picofarads capacitors) so as to have negligible impedances throughout the frequency range of local oscillator 50. However, one (or more) of those capacitors may be chosen to have a significantly lower value (e.g., 82 picofarads) so as to influence the frequency response characteristics of the band (or bands) with which they are associated. In the configuration shown, it was found desirable to choose the value of capacitor 243 to have a value of 82 picofarads so that the tuned circuits of RF stage 30 and local oscillator 50 accurately track one other in response to the tuning voltage throughout band B3. Unfortunately, this was found to have an adverse effect of allowing the portion of tuning circuit 200 to the left diode 203, including inductors 201 and 202 and the associated parasitic elements, to introduce undesired frequency resonances when a channel in band B3 was selected, despite the auxiliary bandswitching provisions described above. However this was remedied by changing the value of resistor 235 from a relatively high value (e.g., 1000 ohms) to a significantly lower value (e.g., 330 ohms). This solution will be understood by considering that due to the relatively large value of capacitors 206 and 236 (e.g., 470 picofarads), which have negligible impedances in the frequency range of local oscillator 50, resistor 235 is effectively in shunt with capacitor 243 and with the series combination of inductors 201 and 202. The result is that the Q of the portion of tuned circuit 200 to the left of inductor 203 has been reduced to the point where it does not introduce undesired resonances when a channel in band B3 is selected.

The output signal of local oscillator 50 is taken from the emitter of transistor 101. The output signal of local oscillator 50 is coupled to mixer 40 through a coupling circuit 400 including a voltage divider 310 and a capacitor 320. The output signal of local oscillator 50 is coupled to prescaler 60 through a coupling circuit 400 including a parallel tuned circuit 410 and a capacitor 420.

Parallel tuned circuit 410 has special significance in that it accommodates the desired input frequency response of prescaler 60 in the following manner. Prescalers suitable for use in television tuners such as the CA- 3163 integrated circuit available from RCA Corporation, Sommerville, N.J., typically have an input sensitivity which is greatest at some middle frequency and poorer at lower and high frequencies. In addition, if the local oscillator signal has a relatively low amplitude, as it may be at the lowest frequency channel, e.g., channel 2, and a significant second harmonic component, the prescaler may undesirably respond to the second harmonic component thereby upsetting the operation of the phase locked loop to which the output of the pescaler is coupled. Parallel tuned circuit 410 solves this problem by providing a transfer characteristic (i.e., the ratio of output voltage to input voltage) which is lowest at the second harmonic frequency for channel 2, i.e., around 202 MHz, and higher at lower and higher frequencies. To accomplish this, inductor 411 and capacitor 413 of tuned circuit 410 are chosen to resonate at the second harmonic frequency, i.e., 202 MHz, of the local oscillator signal for channel 2. Desirably, capacitor 413 is the parasitic shut capacitance of inductor 411. Parallel connected resistor 415 taylors the bandwidth of tuned circuit 410 for the frequency range of local oscillator 50.

What is claimed is:

1. In a tuner, apparatus comprising:
   a variable capacitance element;
   first, second and third inductors coupled in series in the order named between said variable capacitance element and a point of reference potential;
   first switch means for selectively coupling a first point between said first and second inductors to said point of reference potential in response to a first bandswitching signal thereby coupling said first inductor and said variable capacitance element in a first tuned circuit configuration corresponding to first frequency band;
   second switch means for selectively coupling a second point between said second and third inductors to said point of reference potential in response to a second bandswitching signal thereby coupling said first and second inductors and said variable capacitance element in a second tuned circuit configuration corresponding to a second frequency band lower in frequency than said first frequency band;
   control means for generating said first and second bandswitching signals independently of one another one at a time; and
   auxiliary switch means for selectively coupling said second point between said second and third inductors to said point of reference potential in response to said first bandswitching signal without affecting said second bandswitching signal.

2. The apparatus recited in claim 1, wherein:
   said auxiliary switch means includes means for preventing said first bandswitching signal from being affected by said second bandswitching signal.

3. The apparatus recited in claim 2, wherein:
   said first switching means comprises a first switching diode and a first capacitor coupled in series between said first point and said point of reference potential in the order named, said first bandswitching signal being coupled to the junction between said first switching diode and said first capacitor;
   said second switching means comprises a second switching diode and a second capacitor coupled in series between said second point and said point of reference potential in the order named; and
   said auxiliary switch means comprises a first isolation diode for coupling said first bandswitching signal to said junction between said second switching diode and said second capacitor, said first isolation diode being poled so that said second switching diode is caused to conduct when said first switching diode is caused to conduct in response to said first bandswitching signal but said first switching diode is not caused to conduct when said second switching diode is caused to conduct in response to said second bandswitching signal;
   said second bandswitching signal being coupled to the junction between said second switching diode and said second capacitor through a second isolation diode, said second isolation diode being poled so that said second switching diode is caused to conduct in response to said second bandswitching signal but to prevent said second bandswitching signal from being affected by said first bandswitching signal.

4. The apparatus recited in claim 1, further including:
   an amplifier coupled to said variable capacitance element.

5. The apparatus recited in claim 4, wherein:
   said amplifier includes a bipolar transistor having a common collector configuration with its base electrode coupled to said variable capacitance element.

6. The apparatus recited in claim 5, wherein:
   said third, second and first inductors and said variable capacitance element are coupled in series in the order named to said base electrode.

7. The apparatus recited in claim 1, further including:
   a fourth inductor coupled in series between said third inductor and said point of reference potential;
   third switch means for selectively coupling a third point between said third and fourth inductors to said point of reference potential in response to a third bandswitching signal thereby coupling said first, second and third inductors and said variable capacitance element in a third tuned circuit configuration corresponding to a third frquency band lower in frequency than said second frequency band.

* * * * *